United States Patent
Mendenhall

(10) Patent No.: US 7,929,926 B2
(45) Date of Patent: Apr. 19, 2011

(54) TRANSMITTING RF SIGNALS EMPLOYING BOTH DIGITAL AND ANALOG COMPONENTS WITH A COMMON AMPLIFIER

(75) Inventor: Geoffrey Norman Mendenhall, Cincinnati, OH (US)

(73) Assignee: Harris Corporation, Melbourne, FL (US)

( * ) Notice: Subject to any disclaimer, the term of this patent is extended or adjusted under 35 U.S.C. 154(b) by 887 days.

(21) Appl. No.: 11/890,573

(22) Filed: Aug. 7, 2007

(65) Prior Publication Data
US 2009/0040958 A1    Feb. 12, 2009

(51) Int. Cl.
H04B 1/66    (2006.01)
H04B 1/04    (2006.01)

(52) U.S. Cl. ..... 455/102; 455/108; 455/110; 455/127.1; 375/300; 375/302; 330/149

(58) Field of Classification Search .............. 455/42, 455/59, 61, 102, 108, 110, 114.3, 115.1, 455/126, 127.1, 127.2; 375/297, 298, 300, 375/302; 330/43, 44, 128, 139, 149
See application file for complete search history.

(56) References Cited

U.S. PATENT DOCUMENTS

| | | | |
|---|---|---|---|
| 3,585,530 A * | 6/1971 | Wahlgren | 332/180 |
| 3,800,226 A * | 3/1974 | Close | 455/143 |
| 5,315,583 A | 5/1994 | Murphy et al. | |
| 5,339,043 A * | 8/1994 | Chahbazian | 330/56 |
| 5,420,536 A * | 5/1995 | Faulkner et al. | 330/149 |
| 6,049,703 A * | 4/2000 | Staudinger et al. | 455/114.3 |
| 6,144,705 A | 11/2000 | Papadopoulos et al. | |
| 7,043,213 B2 * | 5/2006 | Robinson et al. | 455/127.2 |
| 7,139,534 B2 * | 11/2006 | Tanabe et al. | 455/108 |
| 7,212,791 B2 * | 5/2007 | Arayashiki | 455/91 |
| 7,248,639 B2 * | 7/2007 | Rudolph et al. | 375/268 |
| 7,308,041 B1 * | 12/2007 | Schrader et al. | 375/296 |
| 7,391,261 B2 * | 6/2008 | Dittmer | 330/136 |
| 7,406,131 B2 * | 7/2008 | Rudolph | 375/295 |
| 7,408,401 B1 * | 8/2008 | Roberts | 330/3 |
| 7,593,698 B1 * | 9/2009 | Johnson et al. | 455/102 |
| 2004/0198258 A1 * | 10/2004 | Tanaka et al. | 455/108 |
| 2009/0011730 A1 * | 1/2009 | Liang et al. | 455/127.2 |

* cited by examiner

Primary Examiner — Duc M Nguyen
(74) Attorney, Agent, or Firm — Tarolli, Sundheim, Covell & Tummino LLP

(57) ABSTRACT

Apparatus is presented for broadcasting an RF signal. This includes a signal divider that receives a composite RF signal and provides therefrom first and second signals each having digital and analog components. A phase extractor receives the first signal and provides therefrom a phase modulated RF signal for application to an amplifier. A gain controller varies the gain of the amplifier in accordance with amplitude variations of the second signal.

9 Claims, 3 Drawing Sheets

TRANSMITTING RF SIGNALS EMPLOYING BOTH DIGITAL AND ANALOG COMPONENTS WITH A COMMON AMPLIFIER

BACKGROUND OF THE INVENTION

1. Technical Field

The present invention relates to broadcasting RF signals and, more particularly, to improvements permitting both analog and digital components to be transmitted employing a common amplifier.

2. Description of the Prior Art

The introduction of digital audio broadcasting (DAB) and other forms of vector modulation require simultaneous amplitude and phase modulation of the RF carrier. Conventional FM broadcast transmitters utilize nonlinear RF power amplifiers that cannot convey the amplitude variations needed to accurately replicate the vector modulation.

In the prior art, it is known to employ separate amplification of the vector modulation signal and of the analog FM signal. An example of this is disclosed in FIG. 1 herein. In this example, the output $V_2$ of an existing FM transmitter 10, illustrated as a main FM transmitter, is combined with the output $V_3$ from a digital transmitter referred to as a digital TX (linear) transmitter. The input to the main transmitter 10 is obtained from a conventional FM signal source 14 while the input to the digital transmitter 12 is obtained from a conventional IBOC source 16. The outputs $V_2$ and $V_3$ of these transmitters are combined in a conventional coupler C, which typically is a 10 dB coupler. The coupler, which is sometimes known as an output coupler, provides an output $V_1$ that is supplied to a transmitting antenna 20 for broadcasting the composite signal. The coupler C has ports 1, 2, 3 and 4 with the voltages $V_2$ and $V_3$ being applied to ports 2 and 3. The output at port 1 is supplied to the antenna 20. Port 4 is coupled to a reject load RL.

Because the outputs $V_1$ and $V_2$ are combined only after they have reached a high level of amplitude (because they have already been amplified by separate amplifiers) this is referred to in the art as "high-level combining" or "separate amplification". This type of combining results in high losses because the two signals are not correlated. This may be viewed as the penalty paid for the simplicity involved. In a 10 dB coupler, some of the problems noted include the following: the main FM transmitter needs to have enough headroom in order to increase its output power to overcome the combiner insertion loss. This can be very problematic in specific installations without additional headroom to spare. Major hardware upgrade could be necessary to overcome this issue, such as by replacing the existing main FM transmitter with a more powerful transmitter. A second problem with this type of system is that the overall dissipation increases. Besides the power dissipated by digital transmitter 12, additional energy is wasted at this reject load RL where up to 10% of the main transmitter FM output and up to 90% of the output of the digital transmitter will be dissipated. This inefficiency creates additional heat load for the air-conditioning equipment.

Other prior art examples include the U.S. patents to Murphy et al. U.S. Pat. No. 5,315,583 and Papadopoulos et al. U.S. Pat. No. 6,144,705. It will be noted that the example in FIG. 1 requires a separate linear power amplifier to add the vector modulator signal to the existing analog FM signal. This technique, therefore, requires a second transmitter and inefficient RF combining of the two RF signals. Alternatively, the combined analog and digital signals provided in the composite signal, can be amplified together in a single, linear RF amplifier, with low efficiency. This technique is known as linear, common amplification.

It is desired to add the vector modulation amplitude and phase components to the same nonlinear amplifier used to simultaneously amplify the constant amplitude, analog FM signal. This is the subject of the invention herein to be described below. This invention will allow the existing FM broadcast transmitter to add vector modulation to the existing FM signal without the need for a second transmitter and inefficient RF combining equipment.

SUMMARY OF THE INVENTION

In accordance with the present invention, an apparatus is provided for broadcasting an RF signal. This apparatus includes a signal splitter or divider that receives a composite RF signal and provides therefrom first and second signals each having both digital and analog components. A phase extractor receives the first signal and provides therefrom a phase modulated RF signal for application to an amplifier. A gain controller varies the gain of the amplifier in accordance with the amplitude variations of the second signal.

In accordance with another aspect of the present invention, the composite RF signal includes both digital and analog components and wherein the digital components include vector modulated signals.

In accordance with a still further aspect of the present invention, the gain controller includes an envelope extractor that extracts envelope variations of the vector modulated signal.

BRIEF DESCRIPTION OF THE DRAWINGS

The foregoing and other features of the present invention will become apparent to one skilled in the art to which the present invention relates upon consideration of the following description of the invention with reference to the accompanying drawings, wherein.

DESCRIPTION OF PREFERRED EMBODIMENTS

Figure 1:
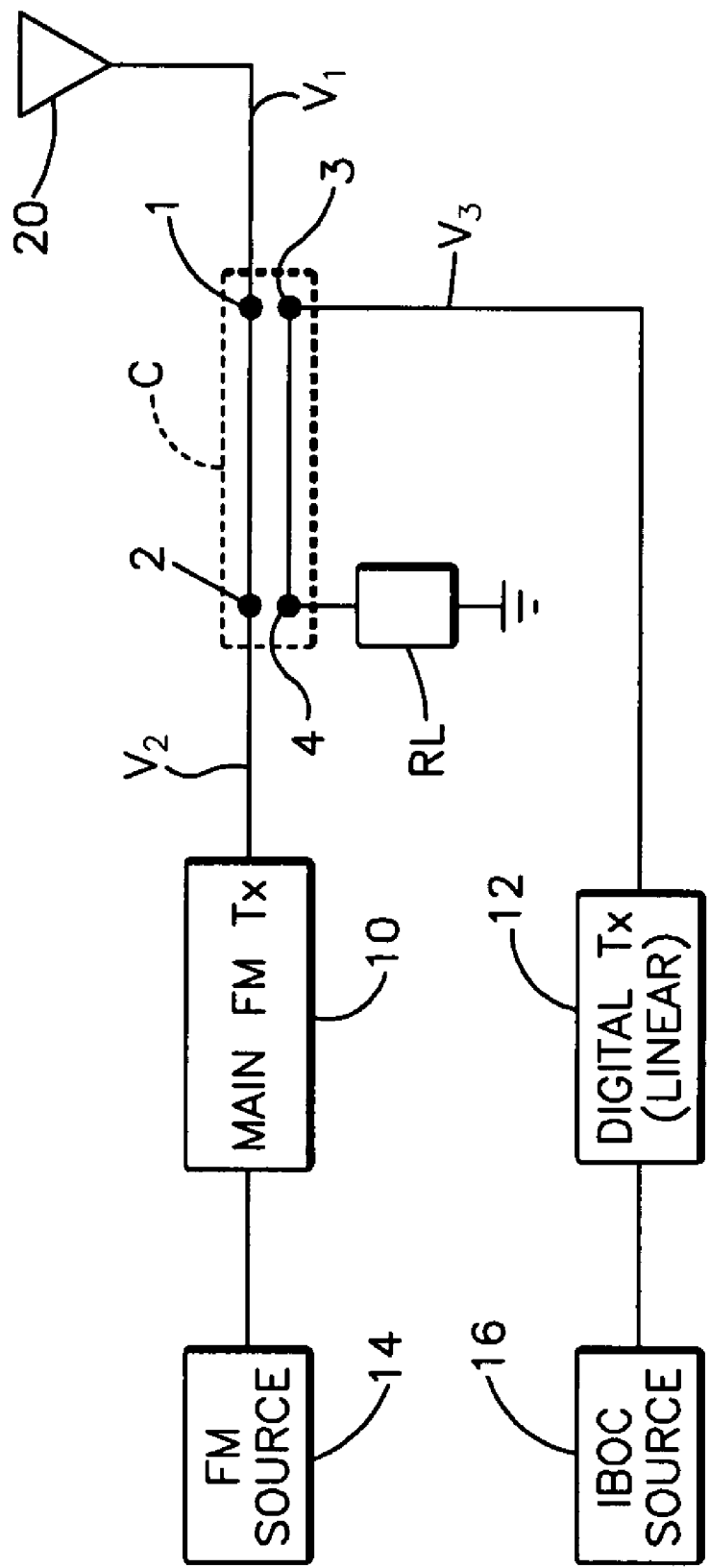
FIG. 1 illustrates a block diagram illustration of a prior art combining circuit.

Existing high power FM broadcast transmitter normally employ a vacuum tube in the final RF power amplifier, such as that in the transmitter 10 of FIG. 1, and which is operated in a saturated Class-C mode. It is difficult to add a second vector modulated signal to the input of this nonlinear amplifier without creating large amounts of RF intermodulation products and excessive distortion to the vector modulated signal. Another approach is to break the vector modulated signal into its polar components representing the instantaneous amplitude of the vector modulated signal and the instantaneous phase of the RF carrier of the vector modulated signal. The complete vector modulation can be reproduced at the output of the nonlinear amplifier by adding the phase information to the existing FM modulation and simultaneously allowing the amplitude component of the vector modulated signal to instantaneously change the gain of the nonlinear amplifier. As will be seen below, it is proposed herein that the amplitude information representing the envelope variations of the vector modulation signal be applied to the screen grid or control grid of the vacuum tube amplifier or to the gate electrode of a MOS-FET. This is achieved by superimposing a wide bandwidth analog baseband voltage representing the instantaneous amplitude of the vector modulation on top of the DC bias normally applied to the screen or control grid or gate electrode.

Figure 2:
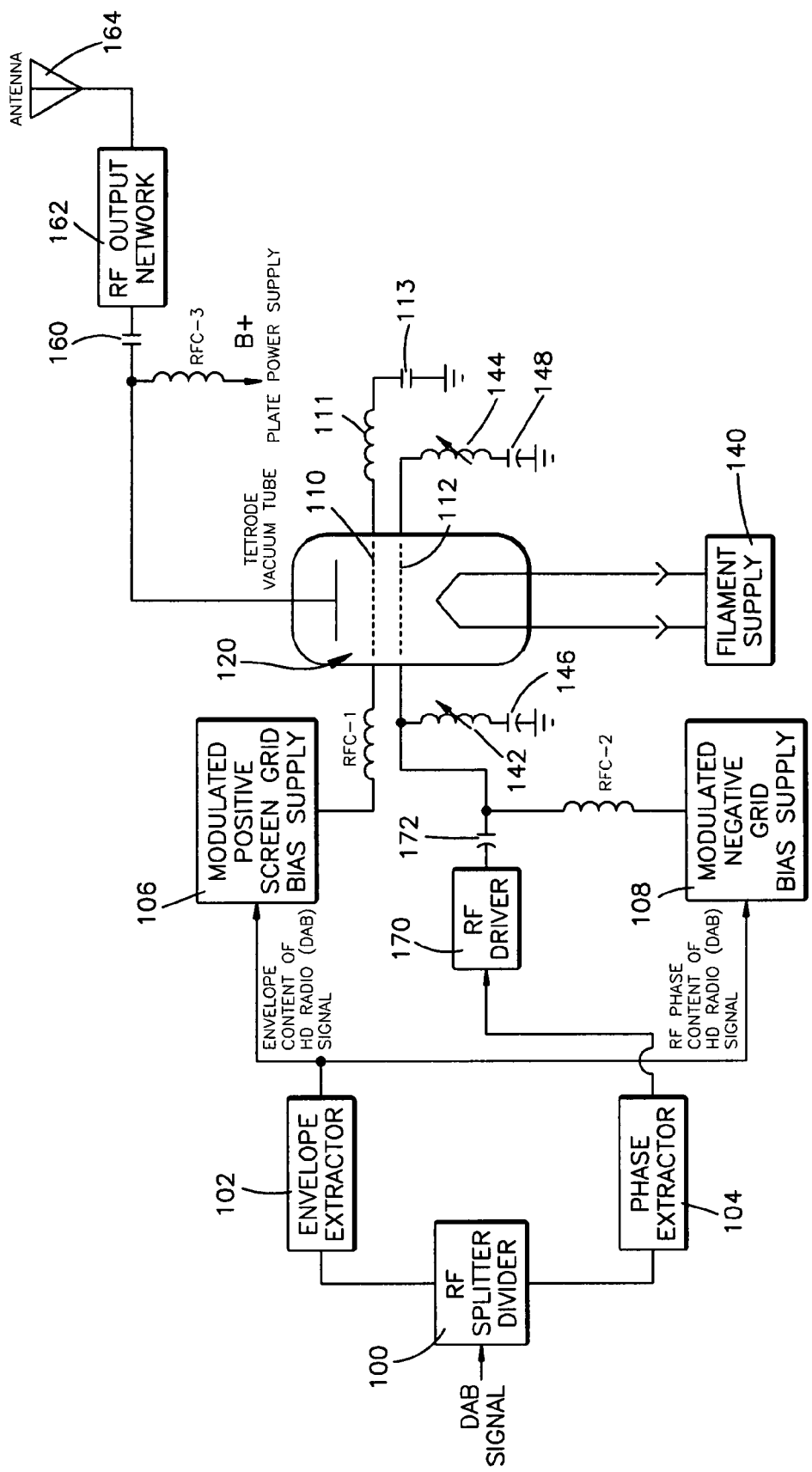
FIG. 2 is a schematic-block diagram illustration of one embodiment of the present invention.

Reference is now made to FIG. 2. The circuit of FIG. 2 presents one embodiment of circuitry to achieve the foregoing objectives. Here a DAB signal is supplied to an RF splitter-divider 100 where the input signal is evenly split in terms of its signal make-up, including both a digital In-Band, On-Channel (IBOC) component and a frequency modulated (FM) analog component, and a first portion is supplied to an envelope extractor 102 and a second portion is supplied to a phase extractor 104. The envelope extractor supplies a signal including the amplitude information representing the envelope variations of the second signal to a modulated positive screen grid bias supply 106. The output of the positive grid and bias supply 106 and the negative version thereof from supply 108 are supplied by way of inductors RFC-1 and RFC-2 to the screen grids 110 and/or the control grid 112 of a tetrode power amplifier 120. In this manner, a wide band analog baseband voltage signal that represents the instantaneous amplitude of the vector modulation is supplied on top of the DC bias normally applied to the screen or control grids of the tube 120. The tube 120 is also connected at its plate to a plate power supply 2+ by way of a third inductor RFC-3. Additionally, a filament supply 140 is connected to the filament of the tetrode. The control grid 112 is connected by way of adjustable inductors 142 and 144 and capacitors 146 and 148 to ground. The output from the tetrode tube is applied by way of capacitor 160 and a typical RF output network 162 to a broadcasting antenna 164..

The phase information is extracted from the composite signal by way of the phase extractor 104 and this information is supplied by way of an RF driver 170 and capacitor 172 to the control grid 112 of tube 120.

Figure 3:
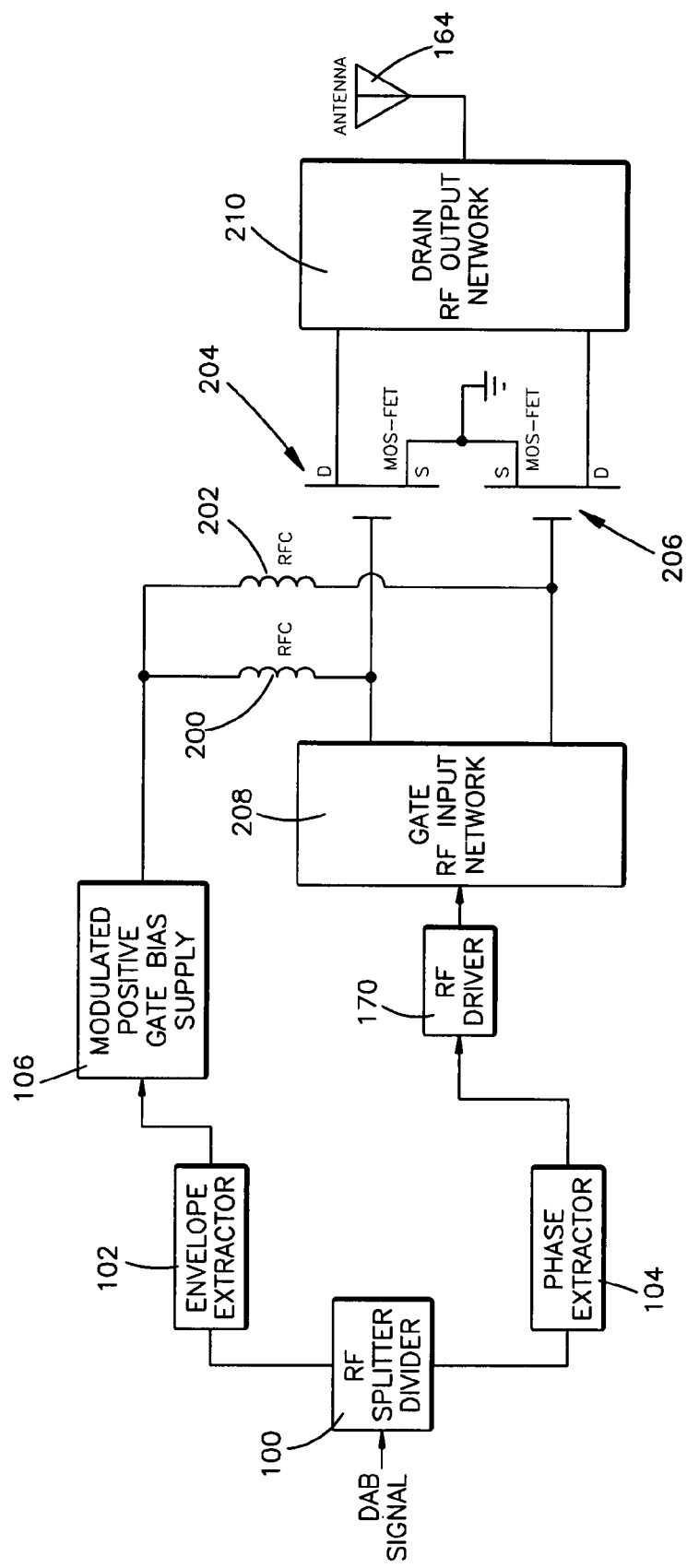
FIG. 3 is a schematic-block diagram illustration of a second embodiment of the present invention.

Reference is now made to FIG. 3 that illustrates a second embodiment of the invention which is quite similar to that illustrated in FIG. 2 and, consequently, corresponding elements are identified with the same character references to simplify the description. Only the differences between the embodiment of FIG. 3 from that of FIG. 2 will be described in detail hereinbelow.

In this embodiment, the output of the modulated positive gate bias supply is supplied by way of RFC inductors 200 and 202 to the gate electrodes of MOS-FET transistors 204 and 206, respectively. The output of the gate driver 170 is supplied to a gate RF input network 208 and the outputs of this network are supplied to the gates of MOS-FETs 204 and 206 and then to network 210 to be broadcasted by antenna 164.

It is to be noted that if the vector modulated signal is small (1/100) in comparison to the analog FM signal, the overall crest factor of the combined signals will be small enough to be accommodated by a gain control range of less than 2 dB. This gain control range can be accomplished through modulation of the grid voltage as described hereinabove.

The method of injecting the analog baseband signal representing the amplitude modulation should maintain a low RF AC impedance for the screen and control grid DC bias supplies and from the screen grid to ground. A wide bandwidth analog operational power amplifier may be inserted in series with the ground return of the grid bias supply. The instantaneous analog voltage adds to and subtracts from the DC grid voltage, thereby changing the gain of the amplifier tube in proportion to the amplitude of the vector modulated signal.

Varying the voltage on the grid of the power amplifier does not cause a change in gain that is exactly proportional to this voltage variation. Pre-correction of the modulating signal is required to compensate for this non-linearity.

Although the invention has been described in conjunction with preferred embodiments, it is to be appreciated that various modifications may be made without departing from the spirit and scope of the invention as defined by the appended claims.

I claim:

1. Apparatus for broadcasting a composite radio frequency (RF) signal comprising:
   a signal divider that receives the composite RF signal and provides therefrom first and second signals each having a digitally modulated In-Band, On-Channel (IBOC) component and a frequency modulated (FM) analog component;
   an amplifier;
   a phase extractor that receives said first signal and provides therefrom a constant envelope, phase modulated, RF signal for application to said amplifier;
   an envelope extractor that receives said second signal and extracts an envelope content of said second signal; and
   a gain controller that varies the gain of said amplifier in accordance with the extracted envelope content of said second signal.

2. Apparatus as set forth in claim 1 wherein said composite RF signal includes an envelope component and a constant envelope phase component.

3. Apparatus as set forth in claim 1 wherein said amplifier includes a control input.

4. Apparatus as set forth in claim 3 wherein said envelope content is provided to the amplifier by superimposing a wide bandwidth signal representing the envelope content onto a direct current (DC) voltage to said control input.

5. Apparatus as set forth in claim 4 wherein said amplifier includes a vacuum tube and wherein said control input includes the control grid of said tube.

6. Apparatus as set forth in claim 4 wherein said amplifier includes a vacuum tube and wherein said control input includes a screen grid of said vacuum tube.

7. Apparatus as set forth in claim 4 wherein said amplifier is a MOS-FET transistor and wherein said control input includes a gate electrode of said transistor.

8. An apparatus for broadcasting a composite radio frequency (RE) signal comprising:
   a signal divider configured to receive the composite RE signal and provide therefrom first and second signals each having a digital In-Band, On-Channel (IBOC) component and a frequency modulated (FM) analog component;
   an amplifier comprising a MOS-FET transistor;
   a phase extractor that receives said first signal and provides therefrom a constant envelope, phase modulated, RF signal for application to said amplifier;
   an envelope extractor that receives said second signal and extracts an envelope content of said second signal as a wide bandwidth signal; and
   a gain controller configured to provide the wide bandwidth envelope content to a gate electrode of the MOS-FET transistor.

9. An apparatus for broadcasting a composite radio frequency (RF) signal comprising:
   a signal divider configured to receive the composite RF signal and provide therefrom first and second signals each having a digital In-Band, On-Channel (IBOC) component and a frequency modulated (FM) analog component;

an amplifier comprising a vacuum tube;

a phase extractor configured to receive the first signal and provide therefrom a constant envelope, phase modulated, RF signal for application to the amplifier;

an envelope extractor that receives said second signal and extracts an envelope content of said second signal as a wide bandwidth signal; and a gain controller configured to provide the wide bandwidth envelope content to one of a screen grid and a control grid of the vacuum tube.

* * * * *